(12) United States Patent
Span

(10) Patent No.: US 8,766,083 B2
(45) Date of Patent: *Jul. 1, 2014

(54) THERMOELECTRIC ELEMENT

(71) Applicant: Gerhard Span, Wattens (AT)

(72) Inventor: Gerhard Span, Wattens (AT)

( * ) Notice: Subject to any disclaimer, the term of this patent is extended or adjusted under 35 U.S.C. 154(b) by 0 days.

This patent is subject to a terminal disclaimer.

(21) Appl. No.: 13/654,592

(22) Filed: Oct. 18, 2012

(65) Prior Publication Data

US 2013/0042900 A1    Feb. 21, 2013

Related U.S. Application Data

(63) Continuation of application No. 12/216,031, filed on Jun. 27, 2008, now Pat. No. 8,373,057.

(30) Foreign Application Priority Data

Jun. 29, 2007    (AT) ................ A 1009/2007

(51) Int. Cl.
     *H01L 35/28*      (2006.01)
     *H01L 35/12*      (2006.01)
     *H01L 35/32*      (2006.01)
     *H01L 35/08*      (2006.01)
     *H01L 31/058*      (2006.01)

(52) U.S. Cl.
CPC ............... *H01L 35/12* (2013.01); *H01L 35/32* (2013.01); *H01L 35/08* (2013.01); *H01L 31/0583* (2013.01); *Y02E 10/50* (2013.01); *Y10S 136/293* (2013.01)
USPC ........... 136/204; 136/203; 136/205; 136/206; 136/248; 136/293; 62/3.2; 438/54; 257/431; 257/467

(58) Field of Classification Search
CPC ..... H01L 31/0583; H01L 35/32; H01L 35/08; H01L 35/02; H01L 35/12
USPC .............. 136/204, 203, 205, 206, 248, 293; 257/431, 467; 438/54; 62/3.2
See application file for complete search history.

(56) References Cited

U.S. PATENT DOCUMENTS

| 3,956,017 A | 5/1976 | Shigemasa |
| 4,500,741 A | 2/1985 | Morimoto et al. |
| 6,084,175 A | 7/2000 | Perry et al. |

(Continued)

FOREIGN PATENT DOCUMENTS

| AT | 410 492 | 5/2003 |
| DE | 38 35 279 | 4/1990 |

(Continued)

OTHER PUBLICATIONS

P-n junction. (2009). In Encyclopaedia Britannica. Retrieved Nov. 23, 2009, from Encyclopaedia Britannica Online: http://www.britanica.com/EBchecked/topic/437322/p-n-junction.

(Continued)

*Primary Examiner* — Devina Pillay
(74) *Attorney, Agent, or Firm* — Wenderoth, Lindd & Ponack, L.L.P.

(57) ABSTRACT

A thermoelectric element includes at least one thermopair and a pn-junction. The thermopair has a first material with a positive Seebeck coefficient and a second material with a negative Seebeck coefficient. The first material is selectively contacted by way of a conductor with the p-side of the pn-junction, and the second material is selectively contacted by way of a conductor with the n-side of the pn-junction.

19 Claims, 10 Drawing Sheets

(56) References Cited

U.S. PATENT DOCUMENTS

| | | | |
|---|---|---|---|
| 6,107,645 | A | 8/2000 | Hidaka |
| 6,294,726 | B1 | 9/2001 | Hassler et al. |
| 6,762,484 | B2 | 7/2004 | Span |
| 2006/0090787 | A1 | 5/2006 | Onvural |
| 2006/0208492 | A1 | 9/2006 | Jovanovic et al. |
| 2006/0237730 | A1 | 10/2006 | Abramov |
| 2007/0227584 | A1 | 10/2007 | Tsunomura et al. |
| 2008/0053514 | A1 | 3/2008 | Micallef |

FOREIGN PATENT DOCUMENTS

| | | |
|---|---|---|
| DE | 101 36 667 | 2/2003 |
| EP | 0 339 715 | 11/1989 |
| GB | 953339 | 5/1959 |
| JP | 50-116192 | 9/1975 |
| JP | 57-115877 | 7/1982 |
| JP | 2-49480 | 2/1990 |
| JP | 4-280482 | 10/1992 |
| JP | 2003-69088 | 3/2003 |
| JP | 2005-228915 | 8/2005 |
| JP | 2005-268284 | 9/2005 |
| JP | 2007-165463 | 6/2007 |

OTHER PUBLICATIONS

Thermal conduction. (2009). In Encyclopaedia Britannica. Retrieved Nov. 25, 2009, Encyclopaedia Britannica Online: http://www.search.eb.com/eb/article-9072067.

Crystal Defects, In NDT Resource Center. Retrieved Nov. 23, 2009, http://www.ndt-ed.org/EducationResources/CommunityCollege/Materials/Structure/crystal_defects.htm.

Shafia "Optimization of Bi2Te3 thin films for microintegrated Peltier heat pumps", Sep. 1997. J. Vac. Sci, Technol. A 15(5), pp. 2798-2801.

English translation of Japanese Office Action issued Apr. 6, 2010 in connection with corresponding Japanese Application No. 2008-170129.

Austrian Search Report issued Apr. 8, 2008 in corresponding Austrian Patent Application.

THERMOELECTRIC ELEMENT

BACKGROUND OF THE INVENTION

The present invention concerns a thermoelectric element comprising at least one thermopair and a pn-junction, wherein the thermopair has a first material with a positive Seebeck coefficient and a second material with a negative Seebeck coefficient and a thermoelectric generator and a thermoelectric cooler with a thermoelectric element of that kind The state of the art is divided into various areas which involve different development stages.

The thermoelectric effect has already been known for more than 100 years, and there is a wide range of materials which can be used for the direct conversion of a temperature difference into electric current (thermoelectric generator) or for cooling upon the application of an external voltage source (thermoelectric cooler). Technical implementation of the generator effect has hitherto always been based on a common fundamental structure (FIG. 6). Two different metals or two differently doped (n- and p-doped) semiconductors are connected to an end, in the normal case the hot end, by way of a metallic conductor, and then the current can be taken off at the other end, which is normally the cold end. The energy for overcoming the differences in the electrical potential between the materials at the contact locations is taken from the ambient heat (Peltier effect).

In order to achieve conversion of the temperature gradient into electric current in the most effective possible fashion, the thermoelectric elements are assembled to constitute a module in such a way that the individual elements are connected electrically in series but thermally in parallel. Those modules can in turn be combined to form larger units (FIG. 7). Such an apparatus can be found for example in EP 339 715 A1.

The choice of the materials used is based on achieving the maximum possible efficiency in the desired temperature range. The efficiency is generally characterized by figure of merit $Z=S^2/\rho\kappa$ (S is the Seebeck coefficient or absolute differential thermoelectric force, $\rho$ denotes the specific resistance and $\kappa$ denotes thermal conductivity). High efficiency is achieved in a material with a high Seebeck coefficient, a low specific resistance, and a low thermal conductivity.

The thermoelectric elements based on pairs of n- and p-type material blocks are those which in that respect are most developed, but have scarcely any advances to show even after more than 50 years of development time. Those thermoelectric elements can be obtained as a product for decades and are used in particular for cooling (thermoelectric cooler, Peltier module).

The essential advantage of that state of the art is that the production processes have been known for decades and are in a mature state. However, it also has the following disadvantages:

The properties of a material which are important for thermoelectricity (S . . . Seebeck coefficient, $\rho$ . . . specific resistance and $\kappa$ . . . thermal conductivity) can be influenced independently of each other only to a very slight degree. That relationship limits the efficiencies achievable at the present time to about 10-20% of the Carnot efficiency.

The configuration of the temperature gradient has no influence on efficiency as it is only the overall difference in temperatures between the hot side and the cold side that plays a part in conventional thermoelectric elements by virtue of the linear relationship between the thermoelectric force and the temperature difference.

Power density is too low to economically provide high power levels.

A further highly promising line of development in the boundary area of thermoelectricity and thermoionic effect has been followed by Eneco, Inc. of Salt Lake City, Utah, USA (Yan R. Kucherov and Peter L. Hagelstein), with the development of a thermoionic converter and a thermal diode.

A thermoionic converter (FIG. 8) comprises a heated metal plate and a cooled metal plate separated by a vacuum and an external circuit. Due to the higher temperature in the heated metal plate, more electrons have enough energy to overcome the potential barrier in the direction of the metal plate than in the reverse direction. In that way, current can be obtained from a temperature difference. It will be noted however that this process can only take place at very high temperatures because of the high potential barrier.

Thermal diodes have the same functional components, but the vacuum is replaced by a semiconductor. A diagrammatic structure of an n-type thermal diode from Eneco, Inc. is shown in FIG. 9. The semiconductor in place of the vacuum provides for a lower potential barrier and therefore the thermal diode functions even at lower temperatures.

With the correct arrangement of further potential barriers between the collector and the gap semiconductor, that arrangement prevents electrons from flowing back again. Accordingly, electrons are accumulated and a higher working voltage can be attained.

The advantages of the above-described configuration are as follows:

The efficiency of conversion of heat into current is higher.

In contrast to thermoelectric elements of the general kind set forth, thermal diodes can be connected in series without efficiency suffering therefrom. Accordingly it is easier to reach the maximum theoretical efficiency.

However, the disadvantages of this configuration are as follows:

This structure operates only with electrons, there is no thermal diode for holes, therefore the circuit has to be closed by way of an electrical conductor, by way of which heat also flows and therefore reduces efficiency.

The effect used only occurs if the thicknesses of the barriers are in the region of the leakage lengths and thus at some 100 nanometers (when InSb is used 1.5 micrometers). At higher temperatures the diffusion of materials is greater, therefore the potential barriers are rounded with time and the lengths necessary for maintaining the effect are no longer observed. The temperatures which can be used for current generation are therefore severely limited upwardly.

In order to utilize the generation of electron-hole pairs, a pn-junction with a temperature gradient can be utilized in known thermoelectric elements (AT 410 492 B).

In the structure shown in FIG. 10, electron-hole pairs are generated at the hot end as the thermal equilibrium between generation and recombination is shifted to the benefit of generation due to the charge carrier drift because of the temperature gradient. The pn-junction is a part of the overall structure which structurally cannot be separated from the location of the temperature gradient.

The advantages of the above-described configuration are as follows:

The operating temperatures can be extremely high depending on the respective material used.

Simple structure similar to a solar cell.

However, the disadvantages of this configuration are as follows:

The recombination of charge carriers cannot be entirely prevented so that efficiency is reduced.

Thick layers are necessary for the transport of charge carriers, and they make more demanding manufacturing methods necessary.

DE 101 36 667 A1 discloses the integration of a diode into an arm of a Peltier element.

GB 953 339 A1 discloses the structural combination of a Peltier element with a diode.

SUMMARY OF THE INVENTION

The object of the invention is to provide an improved thermoelectric element.

That object is attained by a thermoelectric element having the features of the present invention.

The basically novel idea is that of using a pn-junction (for example a diode) as a generation center of electrons and holes as an expansion of a known thermopair.

Without the generation of electron-hole pairs, a thermopair acts only as a charge carrier pump, the properties of which are determined by the choice of a material. The dimensions or other external properties have an only limited influence. Those limits are circumvented by the generation of new electron-hole pairs and markedly higher levels of efficiency are accordingly possible.

When using the thermoelectric element according to the invention in a thermoelectric generator having the features of the present invention, the idea of the invention is that the thermoelectric voltage of a thermopair, which is caused by a temperature difference, is used to bias a pn-junction electrically connected to the hot side in the reverse direction (blocking direction). Electron-hole pairs are generated in that pn-junction by thermal excitation. The extent of that thermal excitation depends on the temperature, the band gap and the number of generation centers:

$$I_{electric} \approx G \approx N_t \exp\left(-\frac{E_t - E_i}{kT}\right)$$

In a pn-junction with bias in the reverse direction current flows by virtue of the generation of electron-hole pairs which are immediately separated by the built-in electrical field and therefore appear as a net current.

The advantages of the present invention are as follows:

More charge carriers can be produced by the generation of electron-hole pairs, than are predetermined by the doping. That makes it possible to achieve a higher power density and efficiency.

The generation of electron-hole pairs is spatially separated from the location at which the thermoelectric voltage occurs and can therefore be optimized by the choice of material or another production process, independently of heat conduction. Also, no temperature gradient is necessary.

Due to the use of a material with a lower band gap in comparison with the thermopair, both transport and also generation of the charge carriers can be optimized.

Further advantageous embodiments of the invention are described below.

For example, the conductor selectively contacting the first material with the p-side of the pn-junction and the conductor selectively contacting the second material with the n-side of the pn-junction can be metallic conductors.

The thermopair and the diode can be connected spatially separately from each other only by an electrical conductor. The thermopair and the diode can also be of different materials in order to be able to optimize the generation of charge carriers and transport thereof separately from each other. For thermal generation both the number of generation centers and also the relationship of thermal energy (temperature) and energy gap are decisive. Transport of the charge carriers in the thermopair is to be optimized separately, for example by using different materials, manufacturing methods and material structures (nanotechnology for modulation of thermal conductivity by supergratings, quantum dots, etc.).

For optimizing the current and thus charge carrier generation, the intrinsic concentration $n_i$ (thus temperature and band gap) and the generation life $\tau_g$ (thus the number of generation centers, the effective cross-section and the temperature) are the determining physical parameters:

$$I \approx G = \frac{n_i}{\tau_g}$$

$$n_i = \sqrt{N_C N_V} \cdot e^{\left(-\frac{E_g}{2kT}\right)}$$

$$\tau_g = \frac{2\cosh\left(\frac{E_r - E_i}{kT}\right)}{v_{th} \sigma_0 N_T}$$

For the invention, the same physical parameters are of significance as in the state of the art. However, it will be noted that with the invention the dependencies of the parameters among each other can be weakened as the lateral change in the parameters has an influence on the efficiency of the overall structure.

In addition, the invention affords a wealth of new candidates for good thermoelectric materials.

The preferred materials for carrying out the invention are semiconductors, wherein the temperature range used determines the choice of the materials.

Compound semiconductors, by virtue of the low thermal conductivity, are the preferred materials for thermoelectric modules. Some examples of good thermoelectric materials are: $Bi_2Te_3$, PbTe, SiGe, clathrate and materials involving a perovskite structure and semiconducting polymers. For making the pn-junction, the materials can be used without having regard to low thermal conductivity as no temperature gradient is necessary.

High to very high doping levels are preferred to keep the specific resistance as low as possible. It will be appreciated that the values for the dopings are dependent on the material. As an example: with PbTe doping levels of $10^{18} cm^{-3}$ and higher are necessary.

There are in particular three large areas in which the invention can be employed:

1. Thermoelectric generators for direct conversion of a temperature difference into current. With that concept any residual heat involved, which otherwise would remain unused, can be used.

2. Thermoelectric cooler: one end becomes hot and the other cold due to a flow of current. That effect can be used for active cooling (for producing low temperatures or for dissipating heat).

3. Boosted thermal conductivity which can serve for efficient passive cooling for example in air conditioning installations or for (power) electronics.

BRIEF DESCRIPTION OF THE DRAWINGS

Further details and advantages of the invention will be apparent by reference to FIGS. 1 through 5 and the related specific description. In particular.

DETAILED DESCRIPTION OF THE INVENTION

Figure 1:
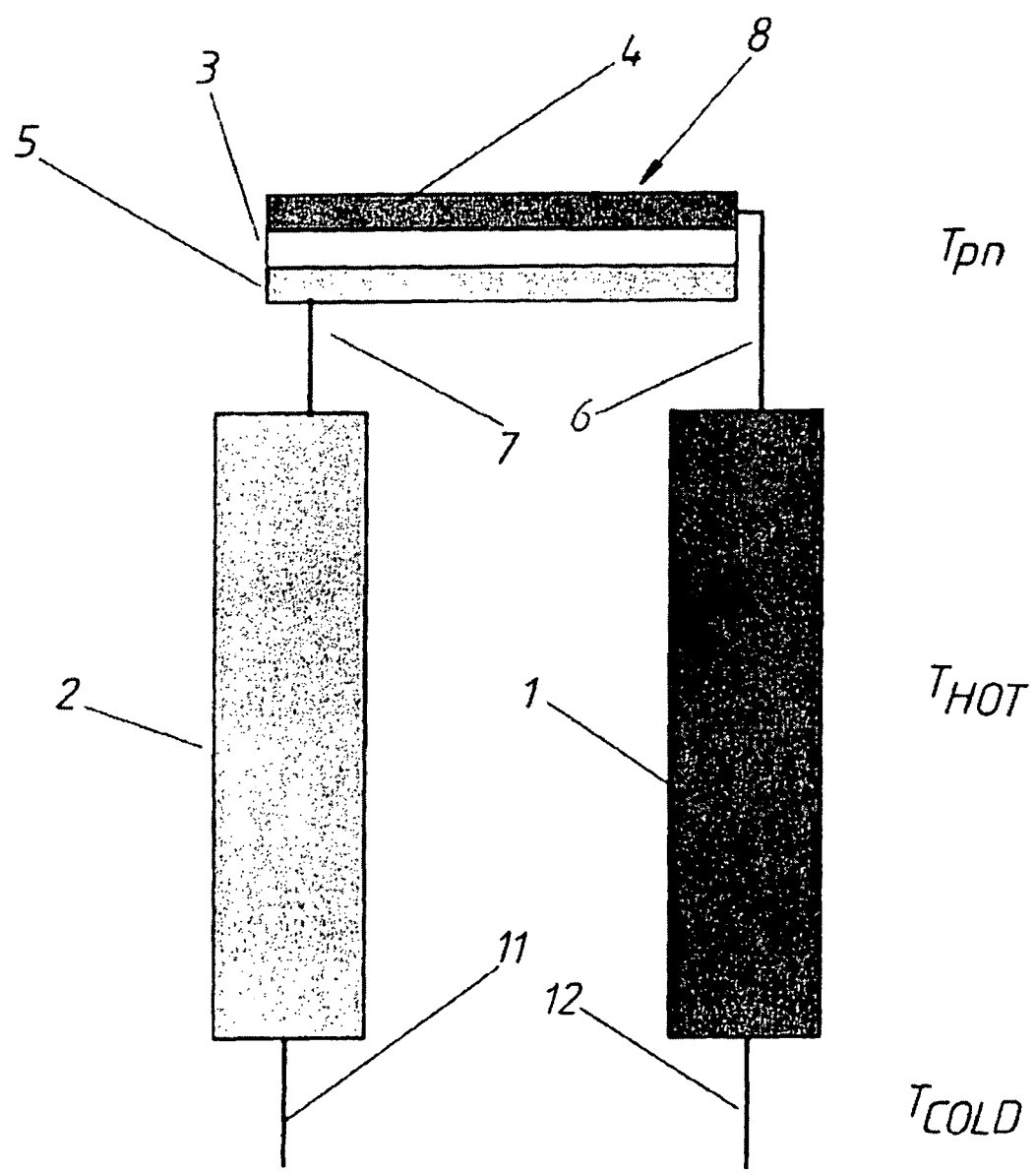
FIG. 1 shows a thermoelectric element of a first embodiment.

FIG. 1 shows a thermoelectric element with a thermopair which has a first material 1 with a positive Seebeck coefficient and a second material 2 with a negative Seebeck coefficient. A pn-junction 3 is further provided in a diode 8. The first material 1 is contacted selectively by way of an electrical conductor 6 to the p-side 4 of the pn-junction 3. The second material 2 is contacted selectively by way of the electrical conductor 7 to the n-side 5 of the pn-junction 3.

When the poles of an external voltage source (not shown) are connected to the contacts 11, 12, the illustrated thermoelectric element operates as a thermoelectric cooler. In that case the pn-junction 3 is electrically poled in the reverse direction by the external voltage source, in regard to one of the two possible polarities. In that case the one end ($T_{cold}$) of the materials 1, 2 cools down. The other end ($T_{hot}$) of the materials 1, 2 heats up.

If in contrast the thermoelectric element is used as a thermoelectric generator, then the one end ($T_{cold}$) of the materials 1, 2 is contacted with a heat sink (not shown) while the other end ($T_{hot}$) of the materials 1, 2 is contacted with a heat source. That produces in the respective materials 1, 2 an electrical voltage (in the first material 1 the side towards the electrical conductor 6 is negatively charged up; in the second material 2 the side towards the electrical conductor 7 is positively charged up). That causes the pn-junction 3 to be connected in the reverse direction. In that case the electrical field produced in the pn-junction 3 spatially separates generated electron-hole pairs which can therefore appear as a nett current. A voltage can be taken off by way of the contacts 11, 12, with the contact 11 being the negative pole and the contact 12 the positive pole.

Figure 2:
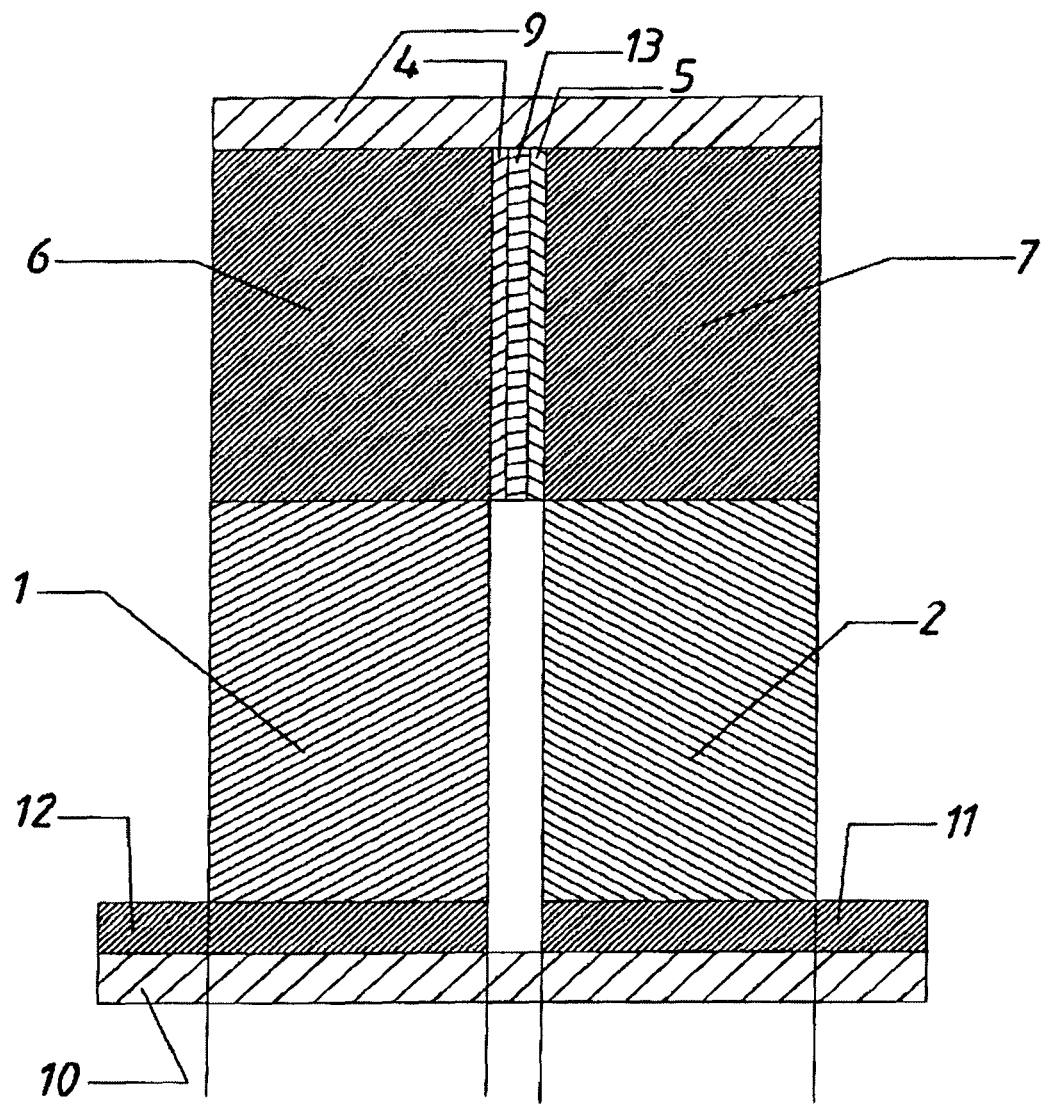
FIG. 2 shows a thermoelectric element of a second embodiment.

A further embodiment of the invention is shown in FIG. 2. In this embodiment the pn-junction 3 is provided in an intermediate layer 13. The pn-junction 3 as well as the first material 1 and the second material 2 (here p-doped and n-doped semiconductor respectively) are thermally connected to a heat source 9. The first material 1 and the second material 2 are further thermally connected at their other end to a heat sink 10.

The first material 1 is contacted by way of the electrical conductor 6 to the p-side 4 of the pn-junction 3. The second material 2 is contacted by way of the electrical conductor 7 with the n-side 5 of the pn-junction 3.

An anode 12 and a cathode 11 are provided at the respective other end of the materials 1, 2, by way of which in the illustrated case of use of the thermoelectric element as a thermoelectric generator a voltage can be taken off.

Figure 3:
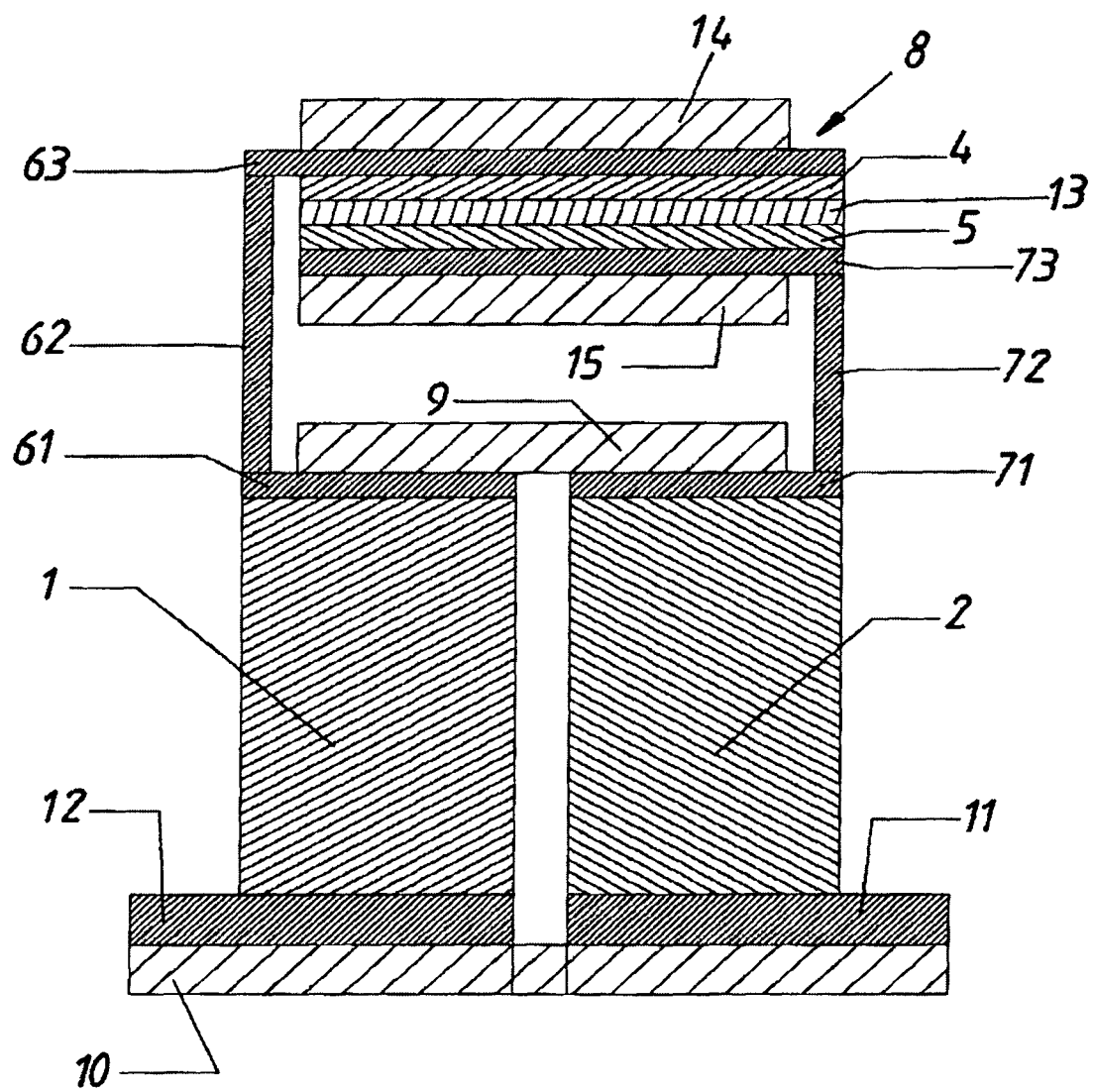
FIG. 3 shows a thermoelectric element of a third embodiment.

In the embodiment of the invention shown in FIG. 3 the pn-junction 3 is arranged spatially separate from the thermopair and connected thereto only by way of electrical conductors 61 through 63 and 71 through 73 respectively.

The diode 8 is connected in that case to separate heat sources 14, 15 while the thermopair is thermally contacted with its own heat source 9. The thermopair is also in thermal contact with a heat sink 10.

Figure 4:
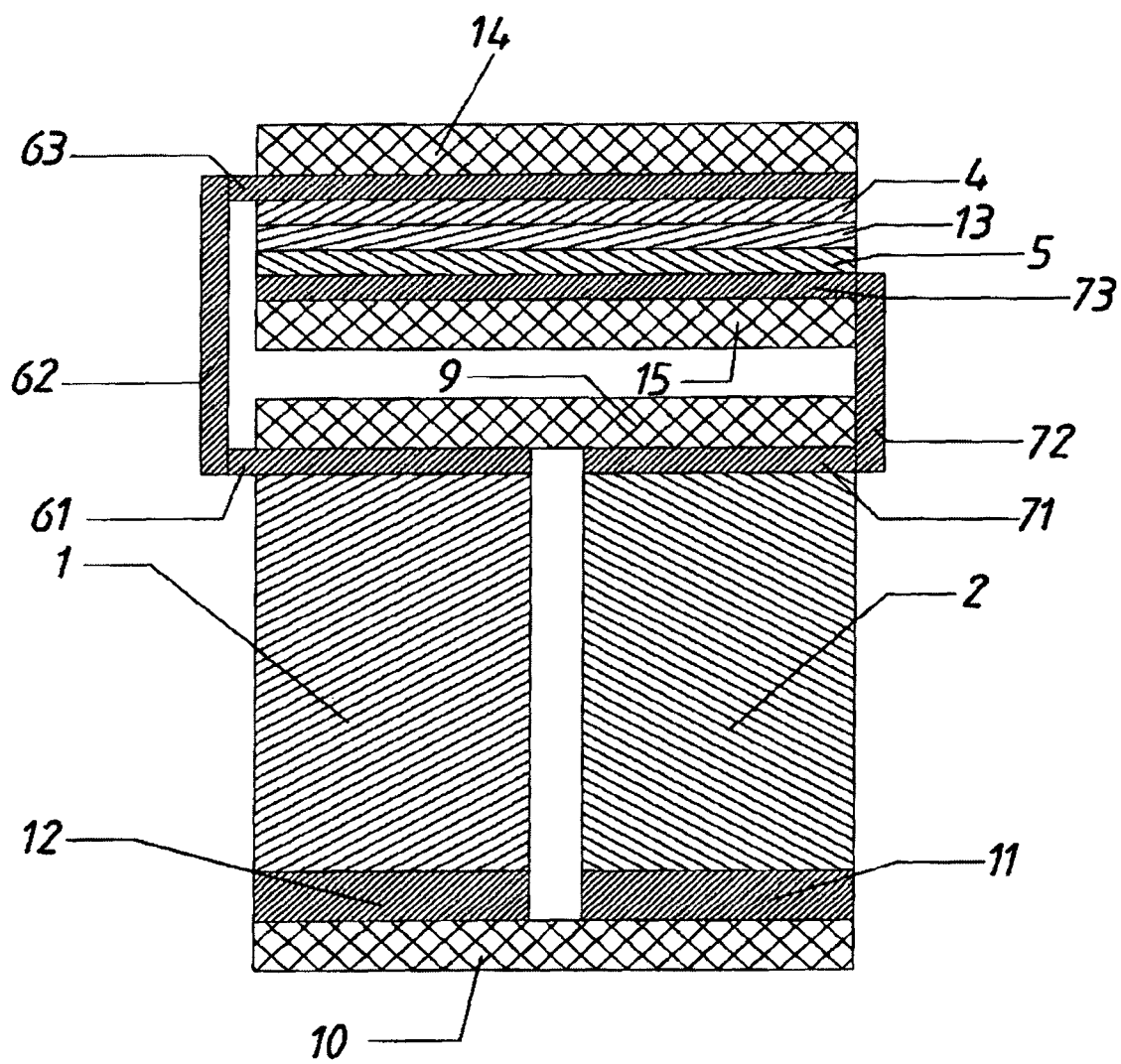
FIG. 4 shows a thermoelectric element of a fourth embodiment.
Figure 5:
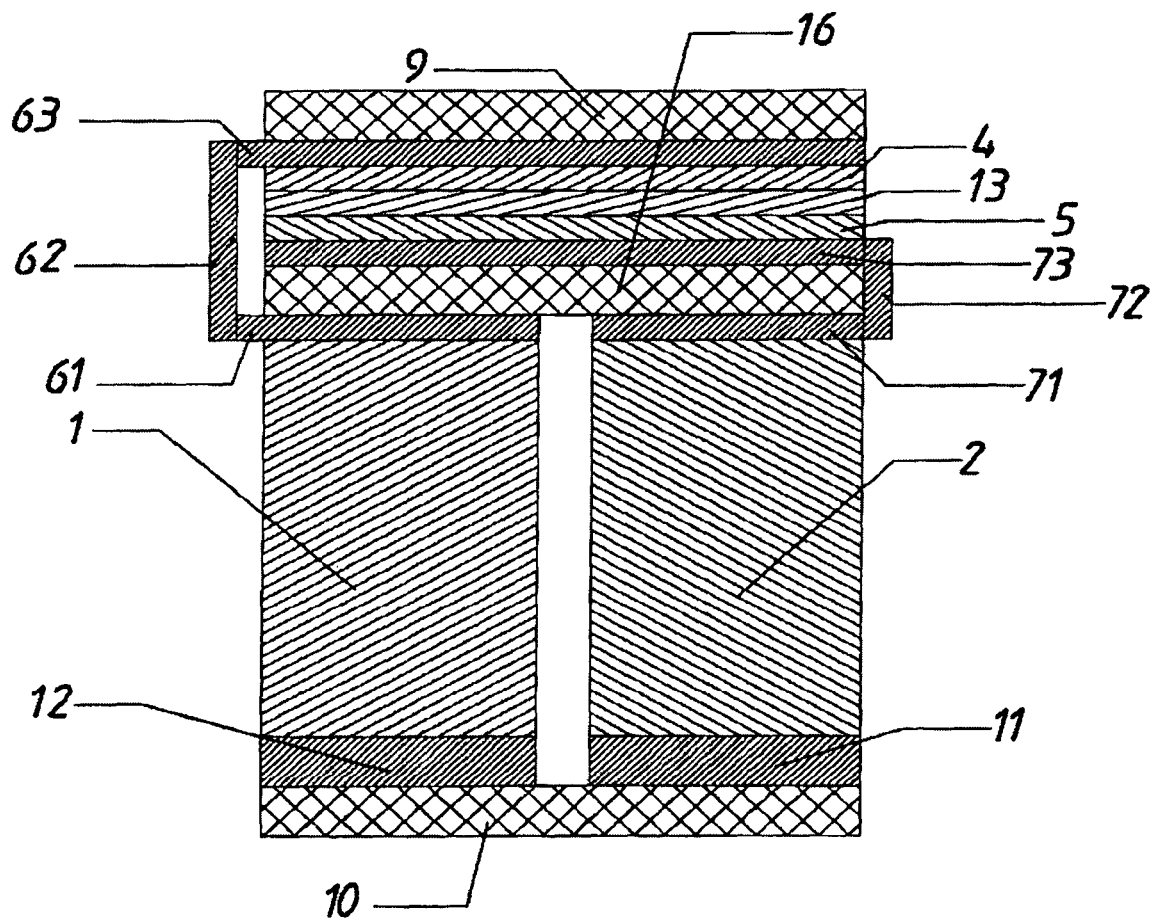
FIG. 5 shows a thermoelectric element of a fifth embodiment.

A similarly constructed thermoelectric element is shown in FIG. 4. The embodiment shown in FIG. 5 differs from that of FIG. 4 in that on the one hand there is a common heat source 9 and on the other hand there is an insulating layer 16 by virtue of the spatially compact configuration.

Figure 6:
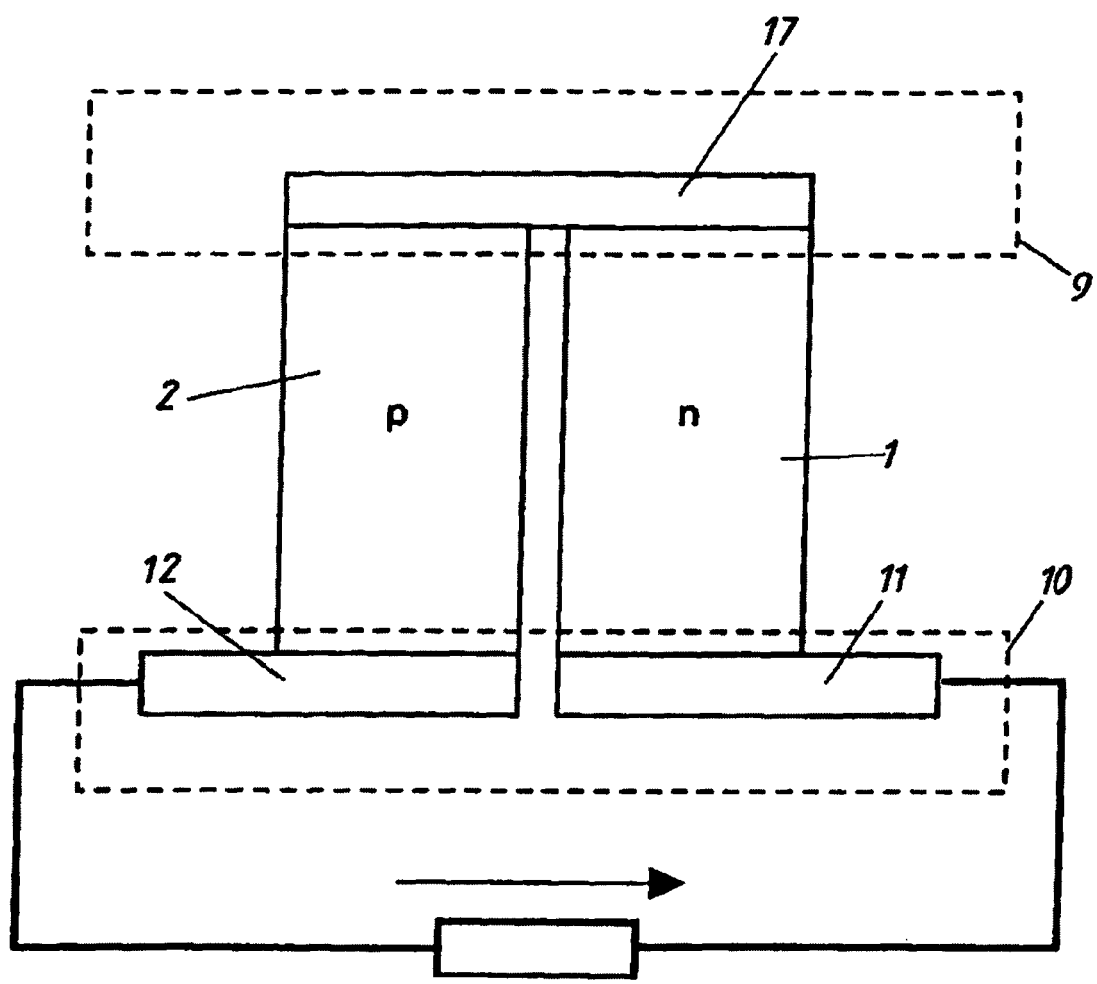
FIGS. 6-10 show a thermoelectric device illustrating the state of the art.
Figure 7:
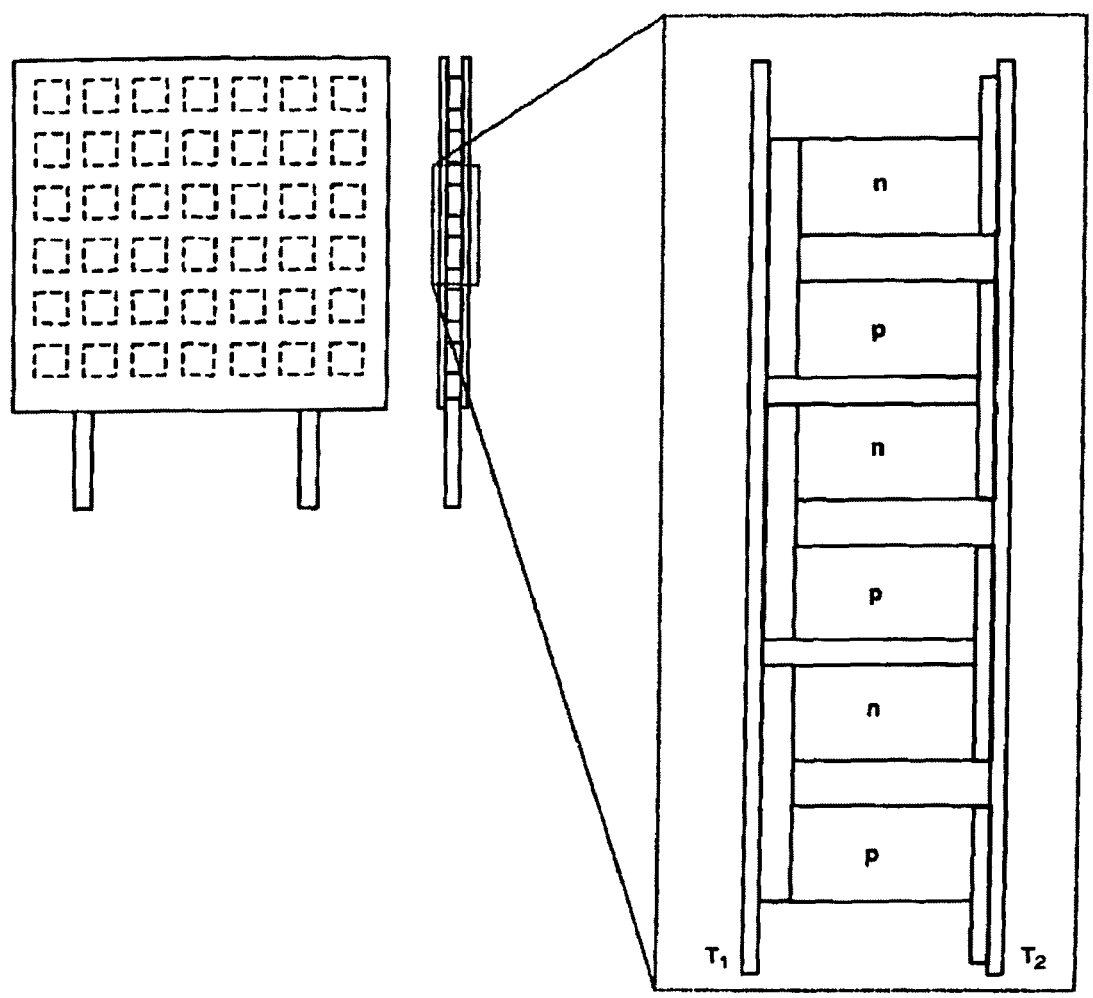

FIG. 6 shows a thermoelectric generator according to the state of the art, wherein the first material 1 and the second material 2 are connected together in the region of the heat source 9 by way of an electrical conductor 17. An anode 12 and a cathode 11 are provided in the region of the heat sink 10. An electric current I flows due to the temperature difference.

Figure 8:
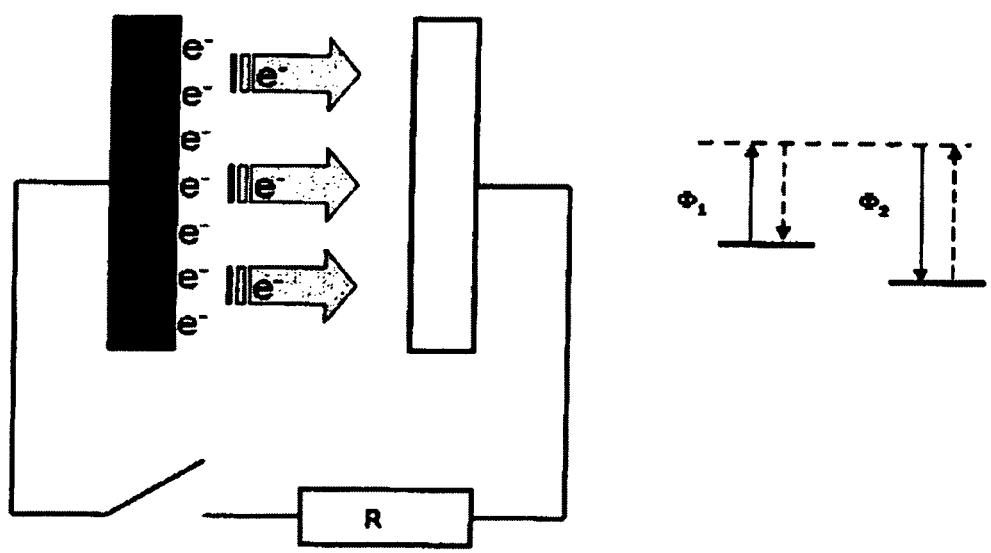
Figure 9:
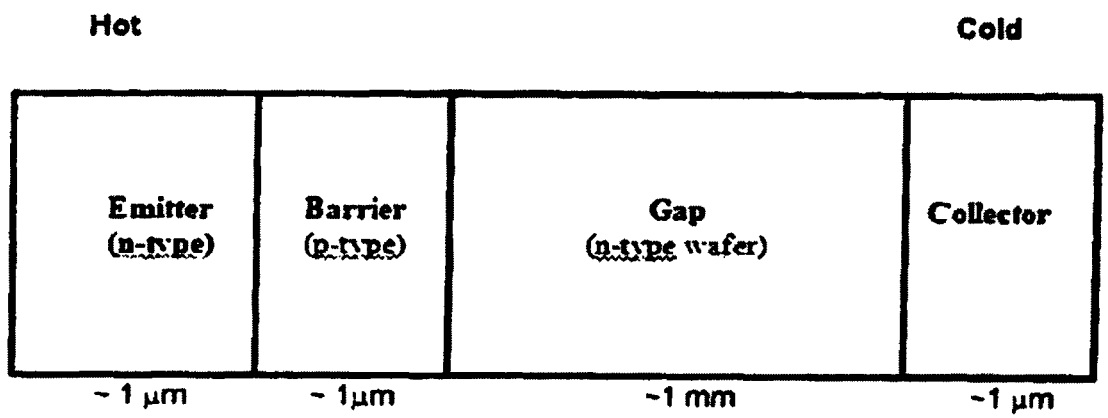
Figure 10:
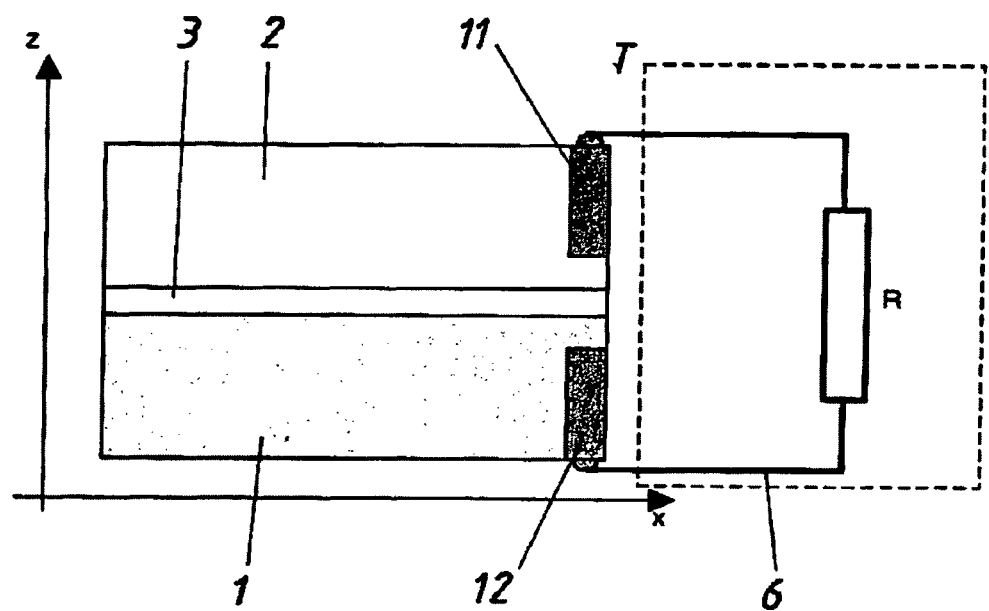

FIGS. 7 through 10 show further state of the art, namely on the one hand a view showing the principle of a thermoelectric module (FIG. 7) made up of individual thermoelectric elements as shown in FIG. 6. The diagrammatic view in principle of a thermoionic converter is shown in FIG. 8. FIG. 9 shows a thermal diode. FIG. 10 shows a thermoelectric element whose pn-junction 3 has a temperature gradient.

The same references denote the same components throughout the entire specific description.

The invention claimed is:

1. A thermoelectric apparatus comprising:
   a thermoelectric element including a thermopair and a pn-junction having a p-side and an n-side;
   a heat source; and
   a heat sink,
   wherein the thermoelectric element, the heat source, and the heat sink are operably coupled to form a thermoelectric generator,
   wherein the thermopair includes a first material with a positive Seebeck coefficient and a second material with a negative Seebeck coefficient,
   wherein the first material is selectively contacted by way of a first conductor with the p-side of the pn-junction and the second material is selectively contacted by way of a second conductor with the n-side of the pn-junction,
   wherein the heat source is thermally coupled to a hot end of the thermopair and the heat sink is thermally coupled to a cold end of the thermopair, and the heat source and the heat sink create a temperature difference in the thermopair between the hot end and the cold end of the thermopair which generates thermoelectric voltage, and
   wherein the thermoelectric voltage electrically poles the pn-junction in the reverse direction by way of the first and second conductors.

2. The thermoelectric generator of claim 1, wherein a side of the first material at the hot end of the thermopair is electrically connected to the p-side of the pn-junction, and a side of the second material at the hot end of the thermopair is electrically connected to the n-side of the pn-junction.

3. The thermoelectric generator of claim 1, wherein the thermopair is arranged such that a side of the first material at the hot end of the thermopair is directly adjacent to a side of the second material at the hot end of the thermopair, and a side of the first material at the cold end of the thermopair is directly adjacent to a side of the second material at the cold end of the thermopair.

4. The thermoelectric apparatus of claim 1, wherein the first material is a p-doped semiconductor.

5. The thermoelectric apparatus of claim 1, wherein the second material is an n-doped semiconductor.

6. The thermoelectric apparatus of claim 1, wherein the pn-junction is provided in a diode, and wherein the thermopair and the pn-junction comprise different materials.

7. The thermoelectric apparatus of claim 1, wherein the thermopair and the pn-junction are arranged spatially separately from each other.

8. The thermoelectric apparatus of claim 1, wherein the thermopair and the pn-junction are connected together only by the first and second conductors.

9. The thermoelectric apparatus of claim 1, wherein the pn-junction is of a textured structure to increase the internal surface area.

10. The thermoelectric apparatus of claim 1, wherein the pn-junction is doped.

11. The thermoelectric apparatus of claim 1, wherein the pn-junction has crystal defects.

12. The thermoelectric apparatus of claim 1, wherein the cross-section of the thermopair is different from the cross-section of the pn-junction.

13. The thermoelectric apparatus of claim 1, wherein the thermopair is connected to the heat sink.

14. The thermoelectric apparatus of claim 1, wherein the first material is connected to a first contact and the second material is connected to a second contact, and
    wherein the first material is spatially separated from the heat sink by the first contact and the second material is spatially separated from the heat sink by the second contact.

15. A thermoelectric apparatus comprising:
    a thermoelectric element including a thermopair and a pn-junction having a p-side and an n-side;
    a heat source; and
    a heat sink,
    wherein the thermoelectric element, the heat source, and the heat sink are operably coupled to form a thermoelectric generator,
    wherein the thermopair includes a first material with a positive Seebeck coefficient and a second material with a negative Seebeck coefficient,
    wherein the first material is selectively contacted by way of a first conductor with the p-side of the pn-junction and the second material is selectively contacted by way of a second conductor with the n-side of the pn-junction,
    wherein the first material is connected to a first contact and the second material is connected to a second contact, and
    wherein the heat source is thermally coupled to a hot end of the thermopair and the heat sink is thermally coupled to a cold end of the thermopair, and the heat source and the heat sink create a temperature difference in the thermopair between the hot end and the cold end of the thermopair which generates thermoelectric voltage, and
    the thermoelectric voltage electrically poles the pn-junction in the reverse direction, from the n-side to the p-side of the pn-junction, by way of the first and second conductors such that a voltage can be taken off with the first contact being a positive pole and the second contact being a negative pole.

16. The thermoelectric generator of claim 15, wherein a side of the first material at the hot end of the thermopair is electrically connected to the p-side of the pn-junction, and a side of the second material at the hot end of the thermopair is electrically connected to the n-side of the pn-junction.

17. The thermoelectric generator of claim 15, wherein the thermopair is arranged such that a side of the first material at the hot end of the thermopair is directly adjacent to a side of the second material at the hot end of the thermopair, and a side of the first material at the cold end of the thermopair is directly adjacent to a side of the second material at the cold end of the thermopair.

18. The thermoelectric apparatus of claim 15, wherein the first material is a p-doped semiconductor.

19. The thermoelectric apparatus of claim 15, wherein the second material is an n-doped semiconductor.

* * * * *